United States Patent [19]

Matsumoto

[11] Patent Number: 4,476,782
[45] Date of Patent: Oct. 16, 1984

[54] METHOD FOR GLAZING PRINTING AREA IN THICK PRINTING

[75] Inventor: Katsutoshi Matsumoto, Kyoto, Japan

[73] Assignee: Dainippon Screen Mfg. Co., Ltd., Japan

[21] Appl. No.: 385,773

[22] Filed: Jun. 7, 1982

[30] Foreign Application Priority Data

Jun. 12, 1981 [JP] Japan .................. 56-91068

[51] Int. Cl.³ .................. B41M 1/06; B41M 7/00
[52] U.S. Cl. .................. 101/450.1; 101/426; 118/60; 427/271; 427/287
[58] Field of Search ............... 118/60; 101/450.1, 426; 427/287, 271

[56] References Cited

U.S. PATENT DOCUMENTS

| 230,366 | 7/1880 | Van Benthuysen | 118/60 |
|---|---|---|---|
| 1,289,507 | 12/1918 | Mason | 118/60 |
| 2,109,774 | 3/1938 | Hooft | 101/426 |
| 2,161,223 | 6/1939 | Bener | 101/426 |
| 3,170,393 | 2/1965 | Reinke | 427/287 |
| 4,360,566 | 11/1982 | Shimizu | 118/60 |
| 4,372,246 | 2/1983 | Azar | 118/60 |
| 4,378,752 | 4/1983 | Knechtel | 118/60 |

FOREIGN PATENT DOCUMENTS

| 202479 | 8/1923 | United Kingdom . |
|---|---|---|
| 986362 | 3/1965 | United Kingdom . |
| 1492878 | 11/1977 | United Kingdom . |

Primary Examiner—Clyde I. Coughenour
Attorney, Agent, or Firm—Brumbaugh, Graves, Donohue & Raymond

[57] ABSTRACT

A second impression cylinder is pressed against the images on the objects printed by an ordinary printing machine in a period during the ink solution deposited thick onto the objects being in a half-dried state. The second impression cylinder is covered at least partially with a smooth oil-repellent layer so that the rugged surfaces of said printed images are made thereby even and flat without any undesirable stain.

3 Claims, 4 Drawing Figures

METHOD FOR GLAZING PRINTING AREA IN THICK PRINTING

BACKGROUND OF THE INVENTION

The present invention relates to a method for glazing the printing area in printing with thick deposit of ink onto the plane sheets absorbing said ink slightly or scarcely, and also relates to an apparatus inherently used in the performance of said method wherein the printing operation is carried out by means of an intaglio or lithography printing plate.

The name plates, and more particularly those used in the electric tools or devices for domestic use, tend recently to be required to have various functions other than their traditional function indicating the designation and/or manufacturer. The recently required functions are the effects as a decorative plate attached to said electric goods or as an instructive plate showing the operational manner for said goods. The known printing method such as the photo-etching and the silk screen printing cannot produce such multifunctional name plates. Therefore, a new printing method for the name plates has been developed to meet the requisite mentioned above. There is similar circumstances also in printing with a thick deposit of the resist-ink on the plastic base sheets laminated with copper foils by means of the pattern of a printed circuit. The typical technique for printing the metal or plastic sheets, which cannot absorb the ink, utilizes an intaglio plate without any dampening water and with thick deposit of ink. Said intaglio plate comprises a printing area and a non-printing area, the former being formed by partially eliminating the oil-repellent thin flim on the raw plate so as to make the part lipophilic whereby the rest part of said plate surface remains lipophobic as the non-printing area. For example, the raw plate consists of an elastic base layer covered with an oil-repellent layer comprising a silicone rubber having in its molecule some photosensitive groups, said elastic layer being made of natural or synthetic rubber. The abovementioned raw plate is exposed through a predetermined pattern and then developed so as to selectively eliminate the parts of said oil-repellent layer thereby to form ink staying recesses serving as a whole as an image area. The remaining oil-repellent portions serve also as a whole as a non-printing area of the printing plate. The thus prepared printing plate is then fixed onto the plate cylinder for the aforedescribed intaglio printing of the objects such as metallic sheet and plastic sheet incapable of absorbing the ink so as to directly print them with thick deposit of the ink but without any dampening water.

In the intaglio printing without use of the dampening water, such an ink is utilized that the transferability from the printing plate to the objects to be printed improved by increasing its viscosity up to, for instance, 1000 poise. The printing speed may also be made slower, for instance, down to 200-300 mm/sec so that a higher transfer energy may be imparted to the ink. As shown diagrammatically in FIG. 1, the ink 1 will be transferred from the printing area of the printing plate to the non-absorbent object 2 such as a metallic sheet wherein the ink solution splits into some clods partially interconnected with each other. FIG. 2 illustrates also a diagrammatic change in the shape of said highly viscous ink after it has been transferred to the object 2 to form a desired image 3 thereon. The change occurs, as the time passes, in such a manner that the surface of the ink forming the image 3 becomes flatter and flatter by virtue of the surface tension of said ink. It is to be noted, however, that in despite of the apparent or superficial macroscopic uniformity in the thickness of said ink forming the image 3 (the thickness being approximately equivalent to 50-30% of the ink thickness previously transferred from inking rollers to said printing plate), the surface of said ink assumes an unevenness like as rippling waves when seen microscopically whereby the light is reflected diffusely to make said surface dim or blurred. This is an unwelcome defect in the kind of the name plate which must have a beautiful surface as one of its important functions or merits. Further, there is still another problem that said ink includes many small bubbles therein, not shown in FIG. 2, which are sealed as pinholes in said ink having a great thickness 7 to 8 $\mu$m when it becomes dry and hardened. An apparent density of said ink layer also will be consequently decreased undesirably to result in a poorer resistance against the etching solution used in the production of base plate for the printed circuits.

According to a known proposal for solving the problems, a larger amount of solvent is admixed with the ink so as to reduce the ink solution viscosity for the purpose of accelerating the natural levelling off effect of the thick deposited ink on the printing area. This is, as will be appreciated, inconsistent with the necessity for improving the ink transferability by means of the higher viscosity of ink in the printing with thick deposit of it. Namely, in such a proposed method, the ink solution will act on the object so soft that an accurate ink transfer thereto from the printing area of printing plate becomes comparatively difficult thereby a fine printing becoming almost impossible.

BRIEF SUMMARY OF THE INVENTION

The method as well as the apparatus are invented in order to solve the aforementioned problems and intended to be adopted in the field of thick printing of non-absorbent materials.

Therefore, from one aspect of the invention, an object thereof is to provide a method for glazing the images on the objects printed with use of an intaglio or lithography plate under condition of thick deposition of the ink wherein the glazing treatment is accomplished by means of a special impression cylinder having an oil-repellent smooth surface adapted to be pressed against said images.

From the other aspect of the invention, another object thereof is to provide an apparatus characterized in that a second impression cylinder is equipped at a position where the objects printed by a plate cylinder and a first impression cylinder engaging therewith will come in contact with said second cylinder after the printing process, and also characterized in that said second cylinder is provided with a smooth oil-repellent surface to press the printing areas on the printed objects, the oil-repellent surface being formed without any lipophilic zone coexisiting therein.

Other objects an merits of the invention will be made clear in the following description of preferred embodiments with reference to the accompanying drawings.

DETAILED DESCRIPTION OF THE INVENTION

Figure 3:
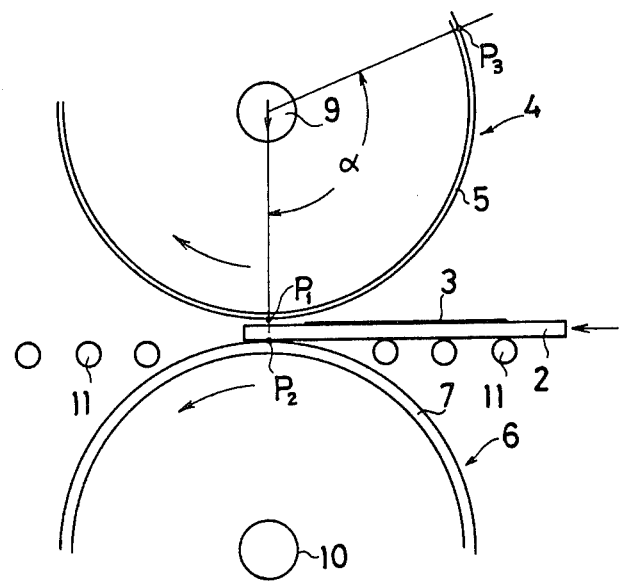
FIG. 3 shows principal parts in a glazing apparatus embodied in accordance with the invention, the apparatus having a structure such that the printed image with a thick deposit of ink can be glazed or smoothed by the invented method.
Figure 4:
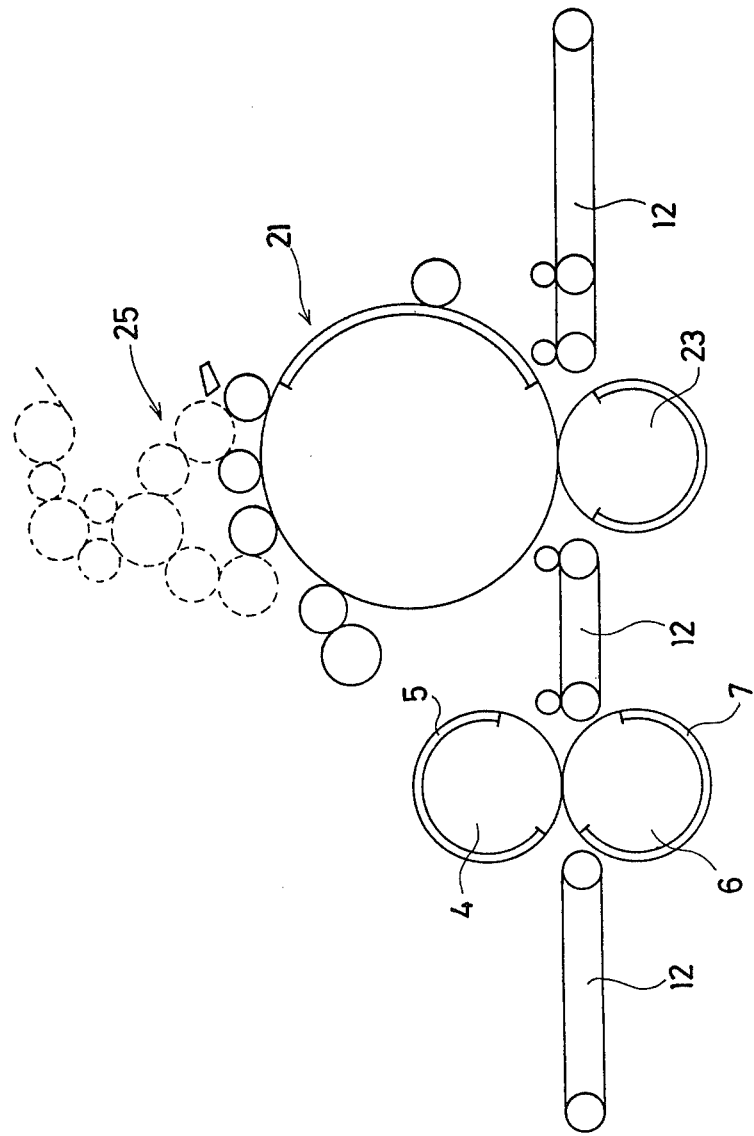
FIG. 4 shows a whole composition of said apparatus.

In FIGS. 3 and 4 showing an embodiment of the invented apparatus for the also invented method, the numeral 4 indicates a second impression cylinder with an outer peripheral surface covered with a smooth oil-repellent layer of, for instance, a silicone rubber. A sustaining cylinder 6 is located at a position where it closely faces with the second impression cylinder, and also is provided with a blanket layer 7 covering the outer peripheral surface thereof. The numeral 2 indicates a printed object such as a platic sheet incapable of absorbing the ink, which object has a fresh image 3 printed immediately before the arrival at shown position by a plate cylinder 21 cooperating with a first impression cylinder 23 on the righthand side wherein the image is formed with a thick deposit of the ink as described hereinbefore. The second impression cylinder 4 and the sustaining cylinder 6 have the same outside diameter inclusive of the oil-repellent layer 5 and the blanket layer 7, respectively. Said cylinders 4, 6 are adapted to rotate synchronously for one revolution at the same speed, for example at a peripheral speed 260 mm/sec, the former rotating clockwise while the latter rotating anticlockwise. They are also controlled, on the other hand, to stop after each revolution. The second impression cylinder 4 is rotatably supported by a shaft 9 with roller bearings whose outer races are secured to the shaft whereas the inner races of said bearings are respectively secured to bosses of the side plates of said impression cylinder 4. The shaft 9 itself does not rotate but is supported with its eccentrically necked ends which are in turn supported by the ends of levers belonging to an apparatus (not shown) for engaging said impression cylinder 4 with the sustaining cylinder 6. FIG. 3 illustrates a disengaged state of the impression cylinder 4.

The sustaining cylinder 6 has a shaft 10 secured thereto at its side plates, the shaft being journalled with bearings (not shown) fixed to the frame work whereby said sustaining cylinder can rotate at the thus fixed position.

The distance between the pressing points ($P_1$) ($P_2$) respectively of said cylinders 4, 6 disengaged from each other can be adjusted, prior to operation, to be slightly smaller than the thickness of the printed object 2. Such adjustment is carried out by raising or lowering the above-mentioned eccentrically necked ends by means of the bearings thereof. The numeral 25 and 11 in the drawings respectively indicate an inking arrangement and a plurality of conveyor rollers, the latter being provided for transportation of the objects to be printed. For example in the embodiment as shown in FIG. 4, carriages 12 are formed in front and rear of the second impression cylinder in a manner that each of them comprises a belt driven by and spanned on the conveyor rollers. A similarly composed carriage 12 is also located before the plate cylinder 21 and the first impression cylinder 23 whereby this carriage and the foregoing carriages build up altogether in series a transportation system for said objects.

The invented glazing apparatus as constructed in the abovedescribed manner will be used in the following manner for the purpose of glazing or smoothing the printing area surfaces of the objects printed with thick deposit of ink. The objects such as plastic sheets 2 are sent into the apparatus immediately after printed in sequence one after another, by means of the conveyor rollers 11. Each of the printed objects is held to rest at a position where its leading end is ahead of the pressing point ($P_2$) by a distance of about 5 mm. Such control of the advancing object 2 is based on a signal generated by contact of said leading end thereof with a limit switch located at a proper position. During the period while the object is kept stationary, a drying of the ink deposited thereon proceeds to a sufficient degree. The length of said period may be changed or adjusted according to the velocity for feeding the objects as well as to the distance between the printing point and the pressing position ($P_1$). The drying rate of ink may be accelerated when means for compulsorily drying the ink is incorporated, if necessary. After the above stationary period, the second impression cylinder 4 is subsequently caused to engage with the sustaining cylinder while both the cylinders 4, 6 are driven to rotate at the same peripheral speed respectively in the arrowed direction whereby pressure imparted to said object is a pressure approximately equal to that in the preceding printing step.

Figure 1:
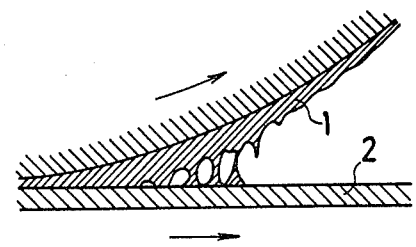
FIG. 1 illustrates diagrammatically a situation of the ink that is transferred from the printing area in a printing plate onto the non-absorbent object which is thereby printed with thick deposit of said ink.
Figure 2:
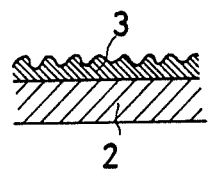
FIG. 2 illustrates also diagrammatically the levelled off state of said ink transferred on the surface of printed object.

In the above glazing operation, the second impression cylinder evenly presses the half-dried surface of said thick printing area 3 printed on the object 2 (the ink viscosity if 1000 poises resulting in a hardened degree of about 5% in the present example) in order to compulsorily level off said surface. The unevenness just like as rippling waves as shown in FIG. 2 disappears from the surface, and also the aforedescribed pinholes are crushed at the same time. Thus, a sufficient smoothing effect will be ensured. It is further to be noted that the second impression cylinder 4 will not become dirty with the half-dried ink of the printed image 3 because the cylinder is covered with the oil-repellent layer 5. In other words, the succeeding printed objects fed into the apparatus are protected from being contaminated although the printing areas 3 thereof may pressed slightly wider.

A further advantageous characteristic of this invention will be now made clear. As described hereinbefore, both the cylinders 4, 6 stop after every one revolution thereof. In the event that they would be adapted to rotate one revolution while they engage each other, the hard edges of said printed objects 2 would pass through between the pressing points ($P_1$) ($P_2$) engaging with one another thereby their hard trailing ends hurting the soft surface of the oil-repellent layer 5 of, for instance, silicone rubber. Fine cracks would take place in such case on the soft surface and remarkably reduce the oil-repellency of said layer thereby resulting in permissible stains on the printed image 3. In order to avoid an occurrence of such unfavorable defects, a center angle ($\alpha$) corresponding to a circular arc of the second impression cylinder 4 will be predetermined such that the arc length is shorter than the printed objects 2 by, for instance, about 20 mm. A dog (not shown) is adjustably protruded form said impression cylinder (as shown in FIG. 3) at the position (P₃) thereof away from the pressing point (P₁) by a distance defined therebetween in accordance with the center angle. The dog will push a limit switch (not shown) provided at the point (P₁) to generate a signal for disengaging the second impression cylinder.

Concerning the widening of said printed image 3 caused by the above glazing or smoothing treatment, the printing area of printing plate may be designed a little slimmer so that the widening can be compensated.

When a different kind of the objects 2 to be printed, such as cardboards having smooth surface and poor absorbency for ink, it will be desirable to reduce the ink viscosity to about 800 poises and to press the printed image surface when the ink has harden to a degree of about 10%.

As will be clearly understood from the foregoing detailed description, the invented method performed solely with use of the also invented apparatus surely and easily effects an extraordinarily excellent glazing treatment of the printing areas printed with thick deposit of ink. Said rugged printing areas formed on the non-absorbent or poorly absorbent objects are pressed evenly by the outer oil-repellent layer of the impression cylinder with a pressure equal to the printing pressure thereby being forcibly levelled off to assume flatter and smoother surfaces having a more beautiful brilliance. Many pinholes or small bubbles that would otherwise remain in the printed images will thoroughly be crushed up so that a significantly deeper color is given to said images without any remarkable number of pinholes embedded therein. The high brilliance makes the printed objects more suitable for the name plates which must be as beautiful as possible while the high density, on the other hand, renders same more fitted for the printed electric circuits which should be as incorrodible as possible.

What is claimed is:

1. A method for glazing an image formed with a thick deposit of viscous oil-based ink on a non-absorbent object wherein the ink image is initially formed with an uneven surface comprising forming an image with viscous oil-based ink on the surface of a plate carried by a first cylinder having a lipophilic image region and a lipophobic non-image region, transferring the ink image from the first cylinder surface directly to a non-absorbent surface of an object to be printed to produce a viscous ink image formed by the thick deposit of ink having an uneven surface, pressing the uneven ink surface of the ink image in the absence of applied heat before the ink has completely dried with a second cylinder having a smooth resilient lipophobic surface made of silicone rubber while moving the surface of the second cylinder in synchronism with the surface of the object to smooth the uneven surface, and then drying the ink.

2. A method according to claim 1 including the step of partially drying the ink before pressing the ink image surface with the second cylinder.

3. A method according to claim 1 or 2 wherein the size of the object is larger than the size of the image and wherein the second cylinder surface engages only the image portion of the object.

* * * * *